(12) United States Patent
Russel et al.

(10) Patent No.: US 7,579,620 B2
(45) Date of Patent: Aug. 25, 2009

(54) FIELD-EFFECT TRANSISTOR COMPRISING A LAYER OF AN ORGANIC SEMICONDUCTOR

(75) Inventors: David Russel, Cambridge (GB); Christopher Newsome, Cambridge (GB); Thomas Kugler, Cambridge (GB); Shunpu Li, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 243 days.

(21) Appl. No.: 11/217,410

(22) Filed: Sep. 2, 2005

(65) Prior Publication Data

US 2006/0049398 A1 Mar. 9, 2006

(30) Foreign Application Priority Data

Sep. 3, 2004 (GB) .................. 0419600.2

(51) Int. Cl.
H01L 29/08 (2006.01)
(52) U.S. Cl. .................. 257/40; 257/642; 257/643; 257/E39.007
(58) Field of Classification Search ............ 257/40, 257/642, 643, E39.007, E51.001, 542, 543
See application file for complete search history.

(56) References Cited

U.S. PATENT DOCUMENTS

| 6,100,954 | A | 8/2000 | Kim et al. |
| 6,300,988 | B1 | 10/2001 | Ishihara et al. |
| 6,433,359 | B1* | 8/2002 | Kelley et al. .................. 257/40 |
| 6,593,977 | B2 | 7/2003 | Ishihara et al. |
| 7,029,945 | B2 | 4/2006 | Veres et al. |
| 7,045,816 | B2 | 5/2006 | Ishihara et al. |
| 2002/0085140 | A1 | 7/2002 | Ko |
| 2002/0121860 | A1* | 9/2002 | Seo et al. .................. 313/506 |
| 2003/0211643 | A1 | 11/2003 | Fujimori et al. |

FOREIGN PATENT DOCUMENTS

| EP | 1 178 546 A2 | 2/2002 |
| EP | 1 341 241 A2 | 9/2003 |
| EP | 1 508 924 A2 | 2/2005 |
| JP | A 2003-282883 | 10/2003 |
| KR | 2000-0038298 | 7/2000 |
| KR | 2000-0062886 | 10/2000 |
| KR | 10-2004-0063176 | 7/2004 |
| WO | WO 03/041184 A2 | 5/2003 |
| WO | WO 03/052841 A1 | 6/2003 |
| WO | WO 2004/004022 A1 | 1/2004 |
| WO | WO 2004/041901 A1 | 5/2004 |
| WO | WO 2005/109542 A1 | 11/2005 |

* cited by examiner

*Primary Examiner*—Steven Loke
*Assistant Examiner*—Thinh T Nguyen
(74) *Attorney, Agent, or Firm*—Oliff & Berridge, PLC

(57) ABSTRACT

Provided is a field-effect transistor (10) which comprises a metal or carbon source electrode (14) and a layer of a functional organic semiconductor (28). A column of an injection material (48) extends through the layer of the functional organic semiconductor (28), the column being in contact with both the source electrode (14) and the layer of the functional organic semiconductor (28). This column (48) facilitates the transfer charge carriers between the source electrode (14) and semiconductor layer (28).

Figure 1:
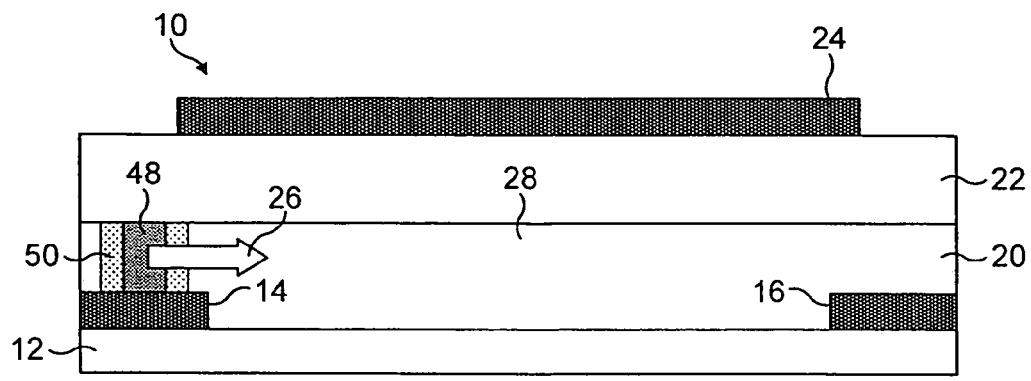

The injection material is preferably an organic compound such as 3-hexylthiophene, polyarylamine, poly(3,4-ethylenedioxythiophene)-polystyrenesulphonic acid or polyaniline.

14 Claims, 1 Drawing Sheet

FIELD-EFFECT TRANSISTOR COMPRISING A LAYER OF AN ORGANIC SEMICONDUCTOR

This application claims the benefit of Great Britain Application No. 0419600.2 filed Sep. 3, 2004. The entire disclosure of the prior application is hereby incorporated by reference herein in its entirety.

The present invention relates to a field-effect transistor comprising a layer of an organic semiconductor, particularly to such a transistor in which transfer of charge carriers between the layer of the organic semiconductor and its associated electrode is facilitated.

It is known to produce field-effect transistors including a semiconductor layer formed from an organic material such as polyfluorene, pentacene, polythiophene or a copolymer of fluorene and thiophene. The layer of organic semiconductor is in contact with inter alia a source electrode arranged to supply current to it. The source electrode is formed from a metal such as gold or carbon in order that it should have relatively high conductivity. This is particularly desirable in the case of large-scale arrays of field-effect transistors such as may be used in display devices.

The contact between the organic semiconductor and the metal or carbon source electrode is often non-ohmic as has been noted by N. Koch et al. in Appl. Phys. Letts., 82, 2003 and by E. Brandon et al. in Appl. Phys. Letts., 83, 2003. This non-ohmic contact results in a contact resistance which inhibits the injection of charge carriers from the source electrode into the organic semiconductor layer. This contact resistance in organic thin film transistors is typically in the megaohm per mm range (E. J. Meiger, Appl. Phys. Letts., 82, 2003) and is manifested by an upward shift in the threshold voltage of the transistor. This has the disadvantage of increasing the voltage needed to operate the transistor.

There have been several proposals to tackle the problem of the high contact resistance at the interface between the source electrode and the organic semiconductor layer. For instance, S. H. Kim et al. propose in J. Korean. Phys. Soc., 42, 2003 to modify the source electrode chemically by depositing thereon a self-assembled monolayer. Alternatively, R. A. Street et al. propose in Appl. Phys. Letts., 81, 2002 altering the geometry of the electrode-semiconductor interface. Finally, L. Edman et al. propose in Appl. Phys. Letts., 84, 2004 the electrochemical doping of the organic semiconductor in order to boost its injection properties thus reducing the contact resistance at its junction with the electrode.

None of these previous proposals has proven to be successful in commercial practice. In particular, they are relatively expensive to adopt and/or do not result in the contact resistance being sufficiently reduced.

The present inventors recognised that the high contact resistance between the layer of organic semiconductor and the source electrode is due to the existence of an energy barrier which charge carriers have to traverse during their transfer from the source electrode into the functional organic semiconductor. This energy barrier is due to the difference in energy between the Fermi energy of the material forming the source electrode and the valence band edge energy of the organic semiconductor. Typically this energy barrier is of the order of 1.5-2 eV. For instance, in the case of the source electrode being formed from gold and the functional organic semiconductor being formed from thiophene, the energy barrier is 1.7 eV.

The present inventors considered that the effect of this energy barrier could be reduced by providing a region of injection material between the source electrode and the layer of organic semiconductor to facilitate the transfer of charge carriers between them. The injection material provides an intermediate energy step where the charge carriers can possess an energy which is between the Fermi energy of the material forming the source electrode and the valence band edge energy of the organic semiconductor which assists the charge carriers to make this transition and thus be transferred from the source electrode to the layer of organic semiconductor.

WO 2003/041184 and WO 2004/004022 both describe field-effect transistors comprising a source electrode, a layer of a functional organic semiconductor and a layer of an injection material which transfers charge carriers from the source electrode into the organic semiconducting layer. In WO 2003/041184, the injection material is a layered metal chalcogenide. The metal chalcogenide is deposited as an extensive layer bridging the source and drain electrodes and so has to be subjected to a subsequent patterning step. In WO 2004/004022, the injection material is a layer of a nitrile or an isonitrile. This is pattern-wise deposited on the electrode due to the injection material being chosen so as to have specific affinity for the material forming the electrode.

The object of the present invention is to provide an alternative and simpler means of providing a region of injection material between the source electrode of a field-effect transistor and its layer of functional organic semiconductor.

Therefore, according to a first aspect, the present invention provides a field-effect transistor comprising a metal or carbon source electrode, a layer of a functional organic semiconductor and a column of an injection material which extends through the layer of the functional organic semiconductor, the column being in contact with both the source electrode and the layer of the functional organic semiconductor to facilitate the transfer of charge carriers between them.

The term "functional organic semiconductor" used in the previous paragraph and elsewhere in this specification means a semiconductor formed from organic molecules and which plays an active role in the function of the field-effect transistor. In this context, the field-effect transistor is typically a thin film transistor.

The column of injection material which contacts both the source electrode and the functional organic semiconductor and extends through the latter has the function of facilitating the transfer of charge carriers from the source electrode to the organic semiconductor thus reducing the contact resistance. The injection material provides an intermediate step in the form of an available energy level between the energy level of the charge carrier in the electrode and the energy level of the charge carrier in the organic semiconductor which charge carriers traverse during their transfer from the source electrode to the semiconductor. The energy of the charge carrier in the electrode corresponds to the Fermi energy of the material forming the electrode. The energy of the charge carrier in the semiconductor corresponds to the valence band edge energy of the functional organic semiconductor. The injection material is chosen so as to have a valence band edge energy lying between the Fermi energy of the material forming the electrode and the valence band edge energy of the functional organic semiconductor.

According to a preferred aspect, the valence band edge energy of the injection material should fall around midway between the Fermi energy of the material forming the source electrode and the valence band edge energy of the functional organic semiconductor. With this in mind, it is preferred that the material forming the injection layer has a valence band edge energy which is:

$$\text{greater than } \left(\frac{S+E}{2}\right) - \left(\frac{S-E}{3}\right)$$

$$\text{and less than } \left(\frac{S+E}{2}\right) + \left(\frac{S-E}{3}\right)$$

wherein S is the valence band edge energy of the functional organic semiconductor and E is the Fermi energy of the material forming the source electrode.

The valence band edge energy of the functional organic semiconductor and the Fermi energy of the material forming the source electrode can be measured by the technique of Ultraviolet Photoelectron Spectroscopy (UPS) such as taught in Principles of Ultraviolet Photoelectron Spectroscopy by J. W. Rabalais, Wiley 1977 and by H. Ishii et al. in Adv. Mater., 11, 1999. The value of the valence band edge energy of a material can also be measured by means of chemical doping such as taught in Chapter 25 of Principles of Instrumental Analysis by D. A. Skoog et al., Saunders College Publishing, Philadelphia.

It is more preferred that the valence band edge energy of the material forming the injection layer should be:

$$\text{greater than } \left(\frac{S+E}{2}\right) - \left(\frac{S-E}{4}\right)$$

$$\text{and less than } \left(\frac{S+E}{2}\right) + \left(\frac{S-E}{4}\right)$$

wherein S and E are as previously defined.

Most preferably, the valence band edge energy of the material forming the injection layer should be:

$$\text{greater than } \left(\frac{S+E}{2}\right) - \left(\frac{S-E}{6}\right)$$

$$\text{and less than } \left(\frac{S+E}{2}\right) + \left(\frac{S-E}{6}\right)$$

Preferably, the source electrode is formed from a metal such as gold. Preferably the functional organic semiconductor is formed from polyfluorene, pentacene, polythiophene or a copolymer of fluorene and thiophene.

Organic/organic interfaces give better injection characteristics than organic/metal interfaces as discussed by H. Ishii et al. in Adv. Meter. 11, 1999. As a consequence, the injection material is preferably formed from an organic semiconducting polymer. Such polymers include for instance poly-3-hexylthiophene (P3HT) or polyarylamine (PAA). Alternatively, the injection material may be formed from an organic conductor. Such conductors include poly(3,4-ethylenedioxythiophene)-polystyrenesulphonic acid (PEDOT:PSS) or polyaniline (PANI).

According to a further aspect, the present invention provides a method of forming a field-effect transistor comprising the steps of:
  (i) depositing a pattern of metal or carbon on a substrate corresponding to the source and drain electrodes of the transistor,
  (ii) depositing a layer of functional organic semiconductor over the pattern;
  (iii) forming a via hole through the functional organic semiconductor to the source electrode,
  (iv) depositing a column of injection material in the via hole and which contacts the source electrode,
  (v) depositing an insulator layer on the functional organic semiconductor layer, and
  (vi) depositing a pattern of conductive material on the insulator layer corresponding to the gate electrode of the transistor, the injection material being arranged to facilitate the transfer of charge carriers between the source electrode and the channel.

According to a further aspect, the present invention provides a method of forming a field-effect transistor comprising the steps of:
  (i) depositing a pattern of conductive material on a substrate corresponding to the gate electrode of the transistor,
  (ii) depositing thereon an insulator layer,
  (iii) depositing thereon a layer of functional organic semiconductor,
  (iv) forming a via hole in the functional organic semiconductor,
  (v) depositing a column of injection material in the via hole, and
  (vi) depositing a pattern of metal or carbon on the functional organic semiconductor corresponding to the source and drain electrodes of the transistor, the source electrode being in contact with the column of the injection material, the injection material being arranged to facilitate the transfer of charge carriers between the source electrode and the channel.

In a particularly preferred aspect of the present invention, the injection material is deposited in the via hole by ink jet printing.

Figure 2:
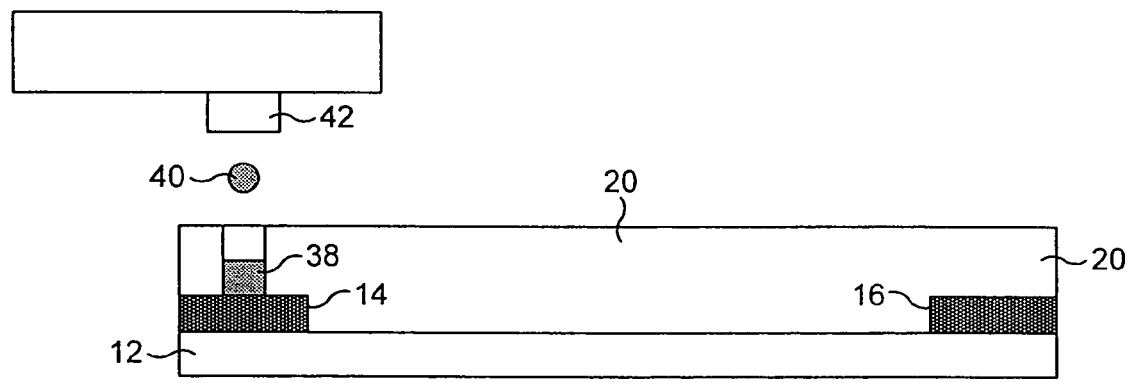
Figure 3:
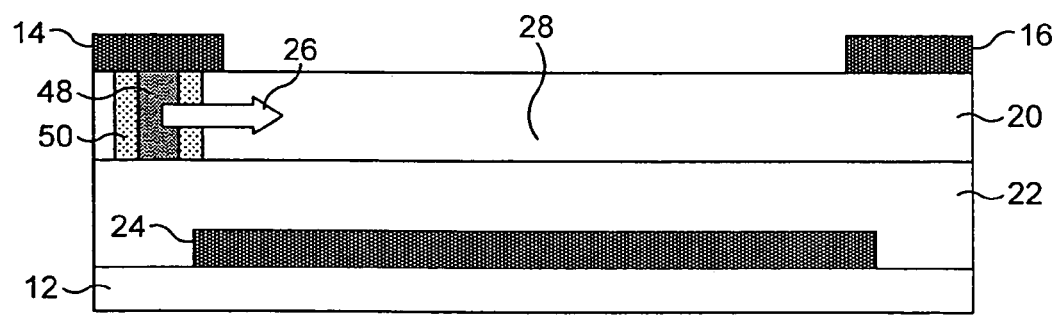

The present invention will now be described in further detail by reference to specific embodiments and the accompanying Figures in which:

FIG. 1 schematically illustrates a cross-section through a thin film transistor in accordance with the present invention incorporating a column of injection material, FIG. 2 schematically illustrates in cross-section the deposition of a column of injection material during the fabrication of the thin film transistor illustrated in FIG. 1; and FIG. 3 schematically illustrates a cross-section through an alternative arrangement of layers of a thin film transistor in accordance with the present invention incorporating a column of injection material.

Turning firstly to FIG. 1, this schematically illustrates in cross-section a first embodiment of the present invention of a top gate/bottom contact thin film transistor 10. The transistor 10 comprises a substrate 12 which may be formed from any conventional material such as plastics, e.g. polyethylenenaphthalate (PEN), or glass. Source and drain electrodes respectively 14 and 16 are patterned on the substrate by a conventional technique such as photolithography or ink-jet printing of a dispersion of conductive particles. The electrodes may be formed from any suitable metal such as gold, chromium or platinum, or from carbon. The electrodes are about 100 nm thick.

A layer of organic semiconductor 20 having a thickness of about 50 nm is then deposited by spin-coating. The organic semiconductor can be formed from such materials as polyfluorene, pentacene, polythiophene, a copolymer of fluorene and thiophene or a derivative of any thereof.

A via hole is then created through the semiconductor layer 20. This can be done for instance by means of solvent drilling such as taught by T. Kawase et al. in Advanced Materials, 13, No. 21, 2001. The solvent drilling can be carried out by selectively ink-jet printing a solvent for the organic semiconductor to dissolve it away leaving a via hole in the desired location. The choice of solvent naturally depends upon the organic semiconductor with a high boiling point organic solvent such as dichlorobenzene being preferred. The diameter of the via hole formed by solvent drilling would typically be 20-60 µm, more typically 30-50 µm. Alternatively, the via hole can be formed by micro embossing which is capable of forming even smaller holes having a diameter of 1 µm or even less.

As illustrated in FIG. 2, an ink-jet printer head 42 is then used to deposit droplets 40 of a solution or dispersion of injection material into the via hole to deposit the injection material 38 therein. The injection material may be either a conductor or a semiconductor. For instance, a column of PEDOT:PSS as the injection material can be formed by dispersing colloidal particles of PEDOT:PSS having an average particle diameter of about 100 nm in water and then projecting droplets of this dispersion having an average size of about 30 µm into the via hole by means of an ink-jet print head. Due to the disposition of the column of the injection material which is formed, it will be noted that there is no possibility of the injection material short-circuiting the source and drain electrodes.

If a solvent or dispersant is used for the injection material in which the previously deposited organic semiconductor 20 is at least partially soluble, then this can lead to some intermixing of the organic semiconductor and injection material. This is advantageous because it helps to enhance the injection of the charge carriers by providing a graded junction. This is illustrated in FIG. 1 where an injection region is provided in the form of a generally central cylinder 48 of injection material surrounded by a tube-shape 50 of intermixed injection material and organic semiconductor. This mixing can be achieved for instance in the case that the injection material is PAA and the organic semiconductor is polyfluorene by depositing the PAA as a solution in toluene. Polyfluorene is soluble in toluene and therefore there is some intermixing of the polyfluorene and PAA at the periphery of the column of injection material.

An insulating layer 22 having a thickness of about 400 nm formed for instance from polymethylmethacrylate, polyimide or polyvinylphenol is then deposited by spin-coating on the semiconductor layer and finally a gate electrode pattern 24 is printed on the insulating layer as illustrated in FIG. 1.

In the present invention, the injection material is provided as a column which extends through the entire thickness of the layer of the functional organic semiconductor. The column is in contact at one of its ends with the source electrode 14. At its other end, it is contact with the insulating layer 22.

When a current is applied between the source and drain electrodes 14 and 16, and a voltage applied to the gate electrode 24, then a channel 28 (sometimes called an accumulation layer) is formed in the functional organic semiconductor 20 below the gate electrode. The injection of charge carriers illustrated by the arrow 26 from the source electrode into the channel 28 is facilitated by the injection column 48. The injection material divides the energy barrier which the charge carriers must traverse into two smaller barriers depending upon the relative energies of the Fermi energy of the material forming the electrode and the valence band edge energy of the injection material and the functional organic semiconductor.

The thin film transistor of this invention is particularly advantageous because the column of injection material facilitates the transfer of charge carriers from the source electrode 14 directly into the channel 28 which forms beneath the gate electrode 24. Thus the charge carriers may enter the layer of organic semiconductor relatively close to the channel. A further advantage of the invention is that there is a large contact area between the column of injection material 48 and the layer of functional organic semiconductor 28 which is particularly beneficial to the injection of charge carriers from the source electrode into the organic semiconductor layer.

An alternative embodiment of a similar thin film transistor is schematically illustrated in cross-section in FIG. 3 where like reference numerals are used to index the same components and elements as are used in FIG. 1. This Figure illustrates a bottom gate/top contact thin film transistor. Again, other arrangements of the electrodes known to those skilled in the art other than those illustrated in FIGS. 1 and 3 are also possible; in particular a top gate/top contact transistor and a bottom gate/bottom contact transistor.

The following Example further illustrates the present invention.

EXAMPLE

Gold source-drain electrodes were defined on a glass substrate by photolithography. Each of these electrodes was in the shape of a rectangle having a width of 0.5 mm, a length of 3.0 mm and a thickness of 0.1 µm. The electrodes were separated by a gap of about 10 µm. The glass substrate bearing the electrode pattern was then cleaned firstly in an ultrasonic bath with acetone, secondly in isopropyl alcohol for 15 minutes, and finally by exposure to UV-ozone for 10 minutes. The cleaned patterned substrate was transferred to a nitrogen glove box and baked for 15 minutes at 100° C.

A transistor of the basic type illustrated in FIG. 1 was then built up whilst maintaining the substrate in the nitrogen glove box. Firstly, a layer of polyfluorene of thickness 40 nm as the functional organic semiconductor was deposited from a 1% weight toluene solution of polyfluorene spun-coated at 1,000 rpm for 60 seconds. This layer was then dried on a hotplate for 20 minutes at 60° C.

A via hole was then bored through the semiconductor layer by means of solvent drilling using dichlorobenzene. Alignment of the bore hole with respect to the source electrode was achieved by the use of alignment markers which is a well known basic technique in the semiconductor device fabrication art. The diameter of the via hole was about 40 µm. In the meantime, an aqueous dispersion of colloidal particles of PEDOT:PSS having an average particle diameter of about 100 nm was formed. This dispersion was then ink-jet printed into the via hole as a succession of droplets having an average size of about 30 µm by means of an ink-jet printhead. The dispersion of PEDOT:PSS was then dried on a hot plate at 60° C. for 20 minutes to form a column of PEDOT:PSS injection material which extends through the thickness of the polyfluorene layer.

An insulating layer having a thickness of 500 nm was then formed by spin-coating an 8% solution of polyvinylphenol in isopropyl alcohol. The spin coating was carried out at 3,000 rpm for 60 seconds after which the insulating layer was dried at 60° C. for 20 minutes.

The device was removed from the nitrogen environment and a gate electrode then printed along the source-drain gap from a dilution of 2-parts deionised water to 1-part PEDOT:PSS (in the ratio of 5:8) supplied by H. C. Starck. The resulting thin film transistor device was then dried at 50° C. for 10 minutes.

A comparative thin film transistor was produced in an identical fashion except that all of the steps associated with forming the column of the polyarylamine injection material were omitted.

The inclusion of the column of injection material has the effect of reducing the threshold voltage of the device and increasing the source drain current. Typically the threshold voltage is reduced by 10V and the source drain current obtained with a gate voltage of 30V is increased by a factor of 3.

The invention claimed is:

1. A field-effect transistor comprising:
a metal or carbon source electrode;
a layer of a functional organic semiconductor; and
a column of an injection material,
the injection material being formed from an organic semiconducting polymer or an organic conductor, the injection material including a solvent or a dispersant in which the layer of the functional organic semiconductor is at least partially soluble,
the column extending through the layer of the functional organic semiconductor, the column being in contact with both the source electrode and the layer of the functional organic semiconductor to facilitate the transfer of charge carriers between them, and
the layer of the functional organic semiconductor and the injection material being intermixed to form a graded junction between the column and the layer of the functional organic semiconductor.

2. The field-effect transistor according to claim 1, wherein the valence band edge energy of the injection material is:

$$\text{greater than } \left(\frac{S+E}{2}\right) - \left(\frac{S-E}{3}\right)$$
$$\text{and less than } \left(\frac{S+E}{2}\right) + \left(\frac{S-E}{3}\right)$$

wherein S is the valence band edge energy of the functional organic semiconductor and E is the fermi energy of the material forming the source electrode.

3. The field-effect transistor according to claim 1, wherein the electrode is formed from gold.

4. The field-effect transistor according to claim 1, wherein the functional organic semiconductor is formed from polyfluorene, pentacene, polythiophene, a copolymer of fluorene and thiophene or a derivative of any thereof.

5. The field-effect transistor according to claim 1, wherein the organic semiconducting polymer the injection material is selected from poly-3-hexylthiophene (P3HT) and polyarylamine (PAA).

6. The field-effect transistor according to claim 1, wherein the organic conductor of the injection material is selected from poly(3,4-ethylenedioxythiophene)-polystyrenesulphonic acid (PEDOT: PSS) and polyaniline (PANI).

7. A field-effect transistor comprising:
a gate electrode;
an organic semiconductor film;
a gate insulating film positioned between the gate electrode and the organic semiconductor film;
a metal or carbon source electrode configured such that the organic semiconductor film is positioned between the source electrode and the gate insulating film;
a drain electrode configured such that the organic semiconductor film is positioned between the drain electrode and the gate insulating film; and
a film of an injection material positioned between the source electrode and the gate insulating film,
the film of the injection material film being formed from an organic semiconducting polymer or an organic conductor, the film of the injection material including a solvent or a dispersant in which the organic semiconductor film is at least partially soluble,
the film of the injection material extending through the organic semiconductor film, the film of the injection material being in contact with the source electrode, and
the organic semiconductor film and the film of the injection material being intermixed to form a graded junction between the organic semiconductor film and the film of the injection material.

8. The field-effect transistor according to claim 7, the injection material film having a valence band edge energy which falls around midway between a Fermi energy of a material of the source electrode and a valence band edge energy of the organic semiconductor film.

9. The field-effect transistor according to claim 7, the injection material film including a first portion and a second portion, the second portion being positioned between the first portion and the organic semiconductor film so as to prevent the first portion from being intermixed with the organic semiconductor film in the graded junction.

10. The field-effect transistor according to claim 7, the injection material including a first portion and a second portion, the second portion surrounding the first portion so as to prevent the first portion from being intermixed with the organic semiconductor film in the graded junction.

11. The field-effect transistor according to claim 7, the injection material film including a PEDOT:PSS.

12. The field-effect transistor according to claim 7, wherein the injection material film has a column shape.

13. The field-effect transistor according to claim 1, wherein the injection material is formed from polyarylamine in the solvent of toluene and the layer of the functional organic semiconductor is formed from polyfluorene.

14. The field-effect transistor according to claim 7, wherein the film of the injection material is formed from polyarylamine in the solvent of toluene and the organic semiconductor film is formed from polyfluorene.

* * * * *